US011330745B2

(12) United States Patent
Kubota (10) Patent No.: US 11,330,745 B2
(45) Date of Patent: May 10, 2022

(54) MANAGEMENT DEVICE, MOUNTING-RELATED DEVICE, AND MOUNTING SYSTEM

(71) Applicant: FUJI CORPORATION, Chiryu (JP)

(72) Inventor: Tomokatsu Kubota, Anjo (JP)

(73) Assignee: FUJI CORPORATION, Chiryu (JP)

( * ) Notice: Subject to any disclaimer, the term of this patent is extended or adjusted under 35 U.S.C. 154(b) by 96 days.

(21) Appl. No.: 16/476,748

(22) PCT Filed: Jan. 10, 2017

(86) PCT No.: PCT/JP2017/000443
§ 371 (c)(1),
(2) Date: Jul. 9, 2019

(87) PCT Pub. No.: WO2018/131066
PCT Pub. Date: Jul. 19, 2018

(65) Prior Publication Data
US 2019/0364705 A1 Nov. 28, 2019

(51) Int. Cl.
*H05K 13/04* (2006.01)
*G05B 19/418* (2006.01)
*G06V 10/98* (2022.01)

(52) U.S. Cl.
CPC ......... *H05K 13/04* (2013.01); *G05B 19/4183* (2013.01); *G05B 19/4185* (2013.01); *G05B 19/41815* (2013.01); *G06V 10/98* (2022.01)

(58) Field of Classification Search
CPC .. H05K 13/04; H05K 13/0882; G05B 19/418; G05B 19/41815; G05B 19/4183; G05B 19/4185; G06K 9/03; Y02P 90/02
See application file for complete search history.

(56) References Cited

U.S. PATENT DOCUMENTS

| 2002/0045143 A1* | 4/2002 | Kawauchi | F23N 5/242 |
| | | | 431/70 |
| 2004/0113814 A1* | 6/2004 | Lochner | G08C 19/02 |
| | | | 340/870.18 |

(Continued)

FOREIGN PATENT DOCUMENTS

| JP | 2002-202813 A | 7/2002 |
| JP | 2012-89634 A | 5/2012 |

(Continued)

OTHER PUBLICATIONS

International Search Report dated Apr. 4, 2017, in PCT/JP2017/000443 filed on Jan. 10, 2017.

*Primary Examiner* — Santosh R Poudel
(74) *Attorney, Agent, or Firm* — Oblon, McClelland, Maier & Neustadt, L.L.P.

(57) ABSTRACT

The management device includes a display section configured to display information to a user, an input section configured to receive an instruction inputted by the user, an acquisition section configured to acquire information from a mounting-related device via a network, an output section configured to output information to the mounting-related device via the network, and a management control section configured to cause the display section to display device stoppage information when the acquisition section acquires device stoppage information indicating that the device has stopped based on an error of the mounting-related processing section configured to stop the device after counting a predetermined count number; and the management control section causes the output section to output a command to resume the mounting-related process and a command to reset the error count to the stopped mounting-related device when a command to resume execution is received from the input section.

16 Claims, 8 Drawing Sheets

(56) References Cited

U.S. PATENT DOCUMENTS

| | | | | |
|---|---|---|---|---|
| 2007/0097763 | A1* | 5/2007 | Tokorozuki | H01L 22/20 365/201 |
| 2008/0316312 | A1* | 12/2008 | Castillo | B60R 25/102 348/148 |
| 2013/0190963 | A1* | 7/2013 | Kuss | B60L 3/0015 701/23 |
| 2016/0078396 | A1 | 3/2016 | Kamioka | |
| 2016/0340867 | A1* | 11/2016 | Matsuzaki | G05D 1/0212 |
| 2017/0231127 | A1* | 8/2017 | Oohori | H05K 13/046 |
| 2017/0311494 | A1* | 10/2017 | Hayashi | H05K 13/08 |
| 2018/0095453 | A1* | 4/2018 | Nishida | H05K 13/0061 |

FOREIGN PATENT DOCUMENTS

| | | | |
|---|---|---|---|
| JP | 2012089634 A * | 5/2012 | |
| JP | 2014-48685 A | 3/2014 | |
| JP | 2015-135886 A | 7/2015 | |
| JP | WO 2015/173864 A1 | 11/2015 | |
| WO | WO 2015/166538 A1 | 11/2015 | |
| WO | WO 2016/051602 A1 | 4/2016 | |
| WO | WO-2016051602 A1 * | 4/2016 | H05K 13/08 |

* cited by examiner

MANAGEMENT DEVICE, MOUNTING-RELATED DEVICE, AND MOUNTING SYSTEM

TECHNICAL FIELD

The present disclosure relates to a management device, a mounting-related device, and a mounting system.

BACKGROUND ART

A management device has previously been proposed, in which an image processing error and a processing method of processing the error are linked and stored in advance to select the processing method corresponding to the image processing error in case of occurrence of the image processing error, and request for permission to execute the processing method is displayed on the screen (see, for example, Patent Literature 1). In this device, for example, a low-speed movement mode of a suction nozzle is used as a countermeasure against a deviation in a component suction position by capturing an image in the low-speed movement mode, which is incorporated into the operation of the mounting device after obtaining permission from an operator, thereby reducing the workload on the operator.

PATENT LITERATURE

JP-A-2015-135886

BRIEF SUMMARY

Technical Problem

However, in the device of Patent Literature 1 described above, although the workload on the operator is reduced by incorporating the countermeasure into the operation of the mounting device, there have been errors and the like that could not be handled by the countermeasure. Such errors include, for example, errors in which the device stops after counting a predetermined count number. When such an error occurs, although it may not be necessary for the operator to visually confirm the error, the operator is required to directly visually confirm the error with the mounting device. In such a mounting system, it is desirable to further reduce the work load of this kind which operators must handle.

It is an object of the present disclosure to provide a management device, a mounting-related device, and a mounting system, those which can further reduce the work load to be handled by an operator in a mounting-related device.

Solution to Problem

The management device, the mounting-related device, and the mounting system disclosed in this specification achieve the above-mentioned main object in the following manners.

A management device disclosed in this specification is a management device, being used in a mounting system including one or more mounting-related devices and exchanging information with the mounting-related devices via a network, each mounting-related device being provided with a mounting-related processing section configured to perform a mounting-related process mounting a component on a board, the management device comprising: a display section configured to display information to a user; an input section configured to receive an instruction from the user; an acquisition section configured to acquire information from the mounting-related devices via the network, and an output section configured to output information to the mounting-related device via the network, wherein a management control section displays device stoppage information on the display section when the acquisition section acquires the device stoppage information from the mounting-related devices based on an error of the mounting-related processing section, being configured to stop the device after counting a predetermined count number, and when an instruction to resume execution from the input section is received, the management control section causes the output section to output a resume command to resume the mounting-related process and a reset command to reset the error count, to the stopped mounting-related device.

In this management device, when the device stoppage information, indicating that the device has stopped, is acquired from the mounting-related device based on the error of the mounting-related processing section, which stops the device upon counting a predetermined count number, the device stoppage information is displayed on the display section. After the user confirms the content of the display section and then inputs an instruction to resume execution from the input section, the management device outputs a resume command to resume the mounting-related process and a reset command of the counted number of errors to the mounting-related device that is stopped. In this manner, this management device is capable of further reduction of the work load that the operator must handle in the mounting-related device since the mounting-related process of the mounting-related device is resumed based on the judgment of the user of the management device. The mounting-related process includes at least one of a mounting process for mounting a component on a board, a printing process for printing a viscous fluid on the board, a conveyance process for conveying the board, and an inspection process for inspecting a state of the component and/or the board. Further, the "predetermined count number" may be empirically determined such that, for example, the number of times (e.g., three or five) from which one can determine that the error has not occurred accidentally, or the number of times from which one can determine that an unnecessary delay may be caused before completion of the production.

DESCRIPTION OF EMBODIMENTS

Figure 1:
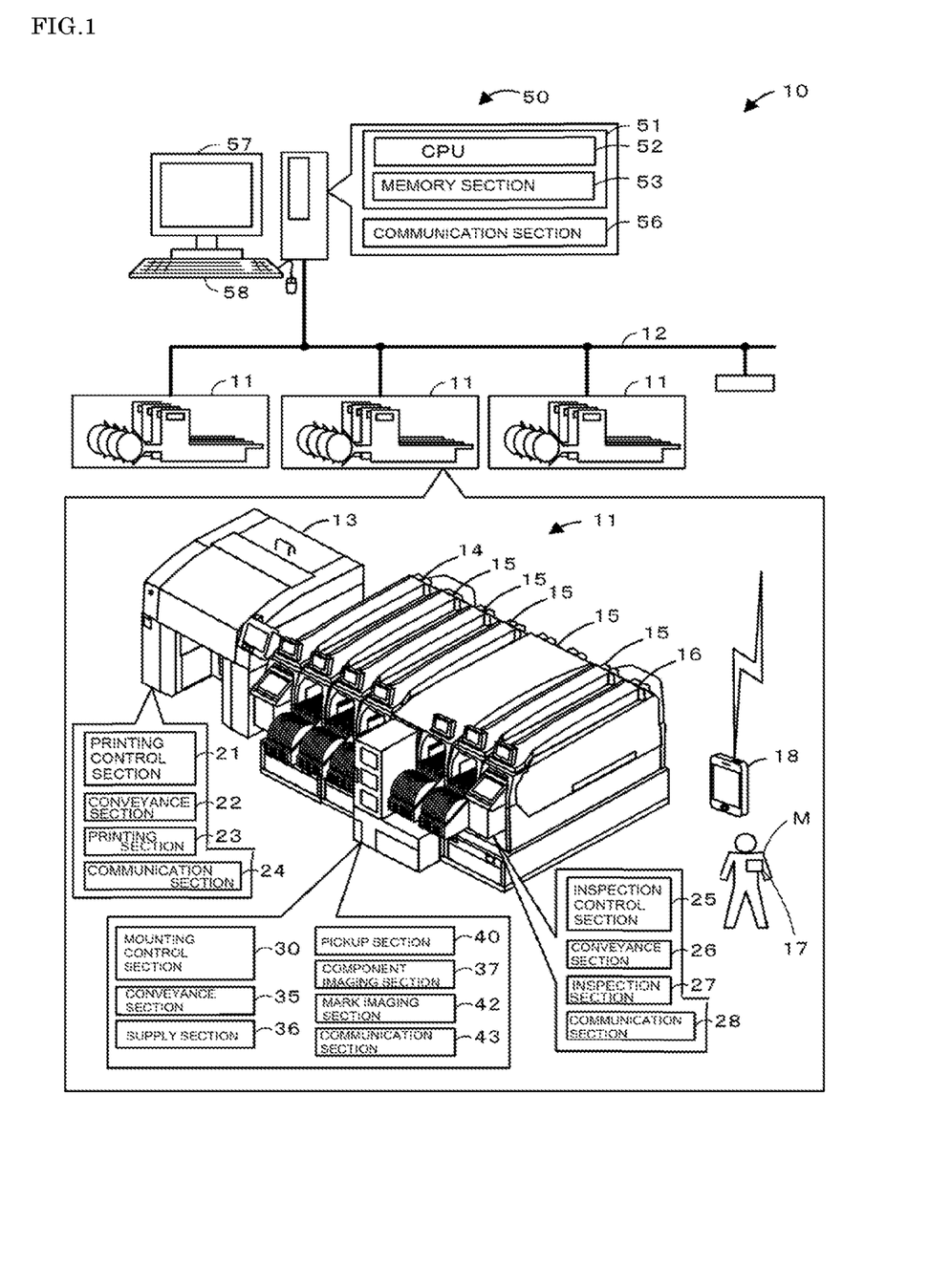
FIG. 1 A schematic diagram illustrating an example of mounting system 10.
Figure 2:
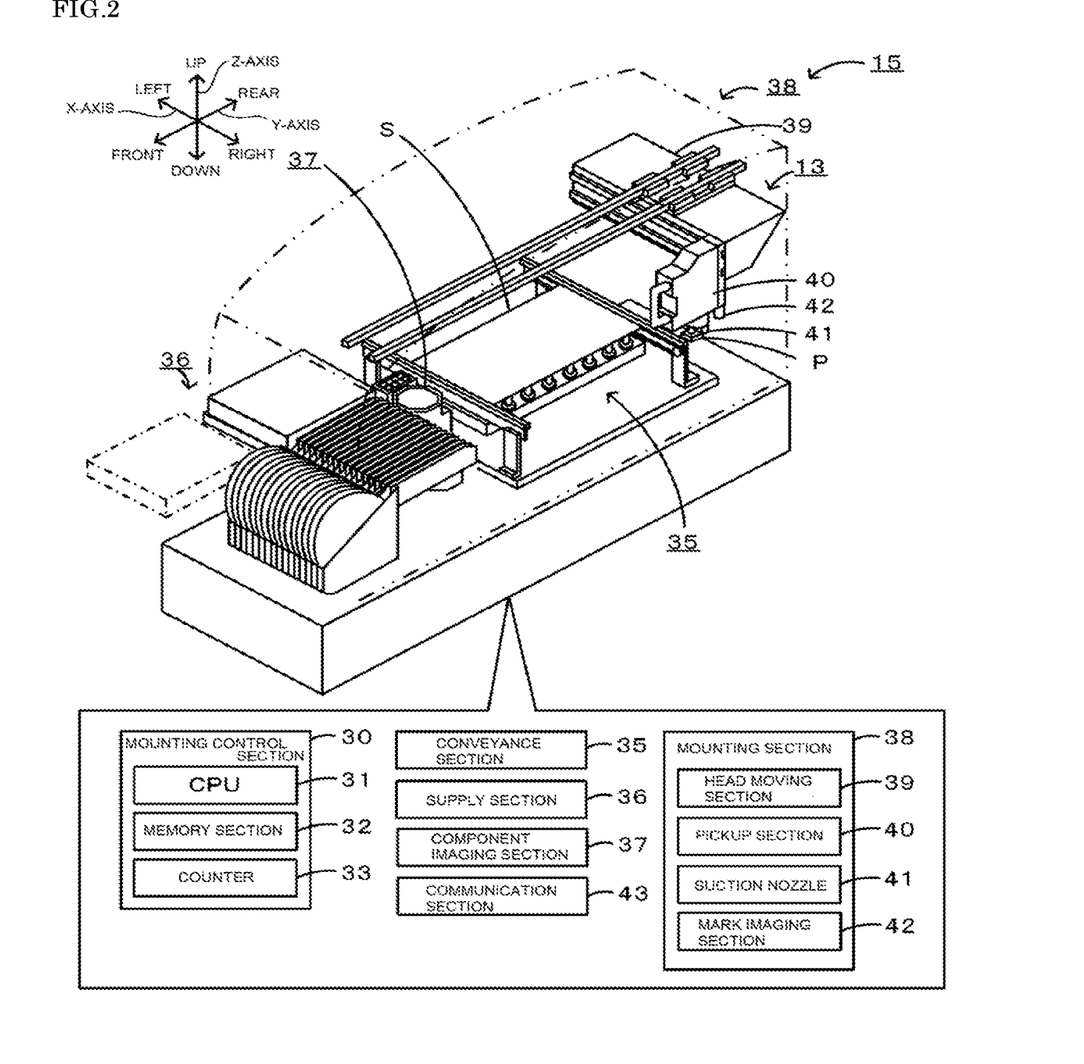
FIG. 2 A schematic diagram illustrating an example of mounting device 15.
Figure 3:
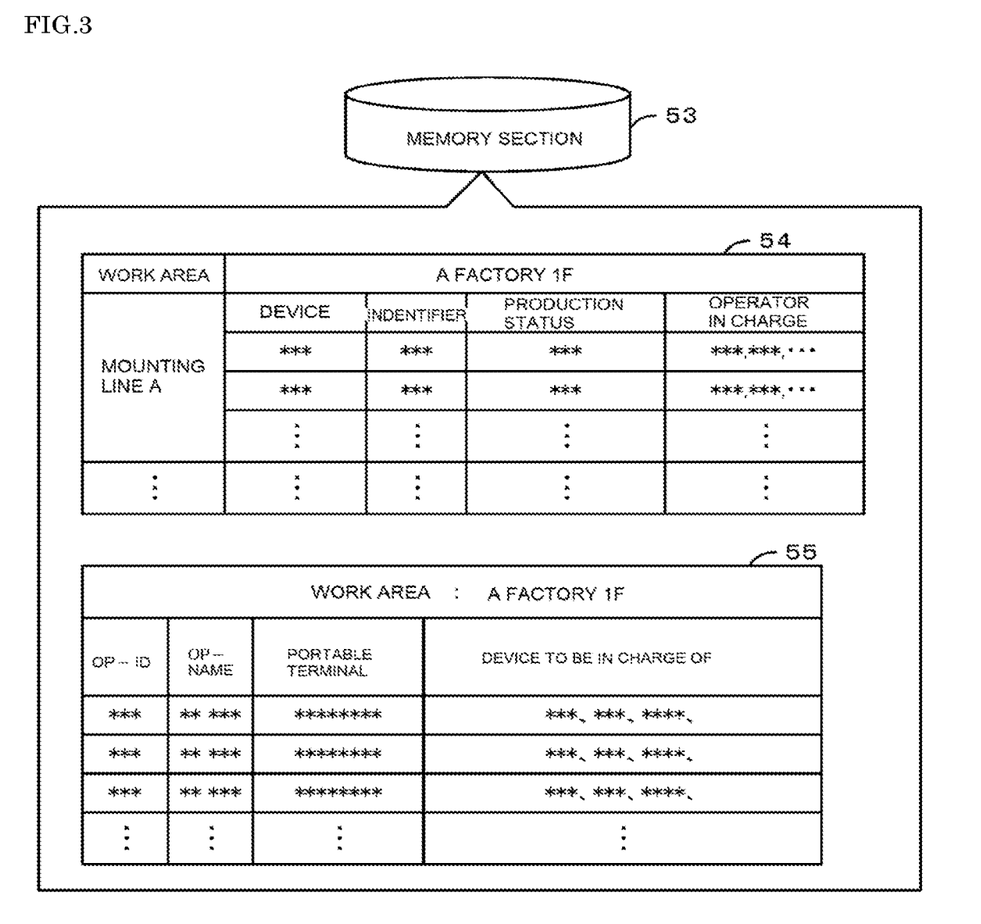
FIG. 3 A diagram showing an example of information stored in memory section 53.

The present embodiment will be described below with reference to the drawings. FIG. 1 is a schematic diagram illustrating an example of mounting system 10. FIG. 2 is a schematic diagram illustrating an example of mounting device 15. FIG. 3 is a diagram of production line information 54 and operator correspondence information 55 stored in memory section 53. Mounting system 10 is configured as a production line for a board including multiple mounting lines 11 configured to execute mounting-related processes relating to mounting component P on board S (see FIG. 2). Mounting system 10 has mounting-related devices connected to network 12, such as a LAN, and management computer (PC) 50 configured to manage information and is connected to network 12. The mounting-related devices include printing device 13, print inspection device 14, mounting device 15, mount inspection device 16, a reflow device and a reflow inspection device (not shown), a board conveyance device, and the like. Mounting system 10 is a system configured to execute mounting-related processing related to mounting component P on board S (see FIG. 2). Mounting-related processing includes, for example, a printing process for printing solder, which is a viscous fluid, on board S, a mounting process for disposing component P on board S, a reflow process for heating board S, and the like. In this embodiment, devices related to reflow are omitted for convenience of description.

Operator M in charge of each device is assigned to mounting line 11. Operator M wears ID card 17, in which information of operator M is stored, and performs various types of work on mounting line 11. In mounting line 11, by reading information on ID card 17 with a reading device (not shown), it is possible to identify operator M performing work in each mounting line 11. Operator M carries portable terminal 18 when performing the work on mounting line 11. Portable terminal 18 is capable of exchanging information with mounting device 15, management PC 50, and the like via network 12, and displays information on mounting line 11. In mounting line 11, operator M may be identified by card input or the like when entering the room.

Printing device 13 is a device for executing a printing process for printing solder on a board. Printing device 13 includes printing control section 21, conveyance section 22, printing section 23, and communication section 24. Printing control section 21 is configured as a microprocessor with a CPU at its center, and includes a memory section and the like for storing various data. Printing control section 21 exchanges information with and controls conveyance section 22, printing section 23, and communication section 24. Conveyance section 22 is a unit configured to convey and secure board S. Printing section 23 is a section for printing a viscous fluid such as conductive paste or adhesive on board S. Printing section 23 may apply (print) solder to a lower board through a pattern hole by pushing solder into the pattern hole in a screen mask using a squeegee. Communication section 24 receives and transmits information to and from other devices via network 12.

Print inspection device 14 is a device configured to inspect the state of the printed viscous fluid. Print inspection device 14 includes an inspection control section, a conveyance section, an inspection section, and a communication section. The inspection section of print inspection device 14 is a section configured to inspect whether the printing state is suitable based on a captured image obtained by imaging, with the imaging section, board S on which the viscous fluid is printed. Print inspection device 14 has the same configuration as mount inspection device 16, which will be described later, and a detailed description thereof is omitted here.

Mounting device 15 is a device that executes a mounting process for mounting component P on board S. As shown in FIGS. 1 and 2, mounting device 15 includes mounting control section 30, conveyance section 35, supply section 36, component imaging section 37, mounting section 38, mark imaging section 42, and communication section 43. Mounting control section 30 is configured as a microprocessor with CPU 31 at its center, and includes memory section 32 configured to store various data, counter 33, and the like. Mounting control section 30 exchanges information with and controls conveyance section 35, supply section 36, component imaging section 37, pickup section 40, mark imaging section 42, and communication section 43. Counter 33 counts the number of occurrences of an error that stops the processing operation of mounting device 15 (also referred to as a recovery-up error) when the number of occurrences of the error is counted a predetermined count number. In mounting line 11, aside from errors of failing to pick up component P or image processing errors in obtaining the shape and state of a picked up component P from a captured image, errors in conveying board S with conveyance section 35 or errors in securing board S, errors in supplying component P with supply section 36, errors in printing with printing section 23, errors in inspecting with inspection section 27, and the like, for example, are defined as recovery-up errors. The predetermined count number is empirically determined such that, for example, the number of times (e.g., three or five) from which one can determine that an error has not occurred accidentally, or the number of times from which one can determine that an unnecessary delay may be caused before completion of the production. Counter 33 is provided in mounting control section 30 for each of multiple recovery-up errors. Conveyance section 35 is a unit configured to convey and secure board S. Supply section 36 is a section configured to supply component P to mounting section 38. Supply section 36 includes, for example, a feeder on which tape holding component P is mounted, a tray on which multiple components P are loaded in an array, and the like. Component imaging section 37 is a unit configured to image one or more components P picked up by pickup section 40 in an upper portion of the imaging range. Mounting section 38 is a mounting unit configured to collect component P from supply section 36 and dispose component P on board S fixed to conveyance section 35. Mounting section 38 includes head moving section 39, pickup section 40, suction nozzle 41, and mark imaging section 42. Head moving section 39 includes a slider, guided by guide rails, which moves in the XY direction and a motor for driving the slider. Pickup section 40 is a mounting head detachably mounted on the slider and is moved in the XY direction by head moving section 39. One or more suction nozzles 41 are detachably mounted on the lower face of pickup section 40. Suction nozzle 41 collects component P by using negative pressure. Component P may be picked up with a mechanical chuck or the like, which mechanically holds component P, in addition to suction nozzle 41. Mark imaging section 42 is a section configured to image a mark or the like on board S, for example, in the lower portion of the imaging range. Mark imaging section 42 is disposed on the lower face of pickup section 40 and moves in the XY direction along with the movement of pickup section 40. Mark imaging section 42 can also image a component collection position of supply section 36. Communication section 43 receives and transmits information to and from other devices via network 12.

Mount inspection device 16 is a device for inspecting the mounting state of component P subjected to the mounting process. Mount inspection device 16 includes an inspection control section 25, conveyance section 26, inspection section 27, and communication section 28. Inspection control section 25 is configured as a microprocessor with a CPU at its center, and includes a memory section and the like configured to store various data. Inspection control section 25 exchanges information with and controls conveyance section 26, inspection section 27, and communication section 28. Conveyance section 26 is a unit configured to convey and secure board S. Inspection section 27 is a section for inspecting whether the shape and the disposed position of component P are suitable based on a captured image obtained by imaging board S on which component P is disposed with a camera. Communication section 28 receives and transmits information to and from other devices via network 12.

The reflow device is a device configured to execute a reflow process of board S, although not shown. The reflow device melts solder by heating board S on which component P is disposed, and then, by cooling, electrically connects and fixes component P on board S. The reflow inspection device is a device configured to inspect board S after reflow. The reflow inspection device detects the conduction of the reflowed circuit board and inspects whether it is suitable as a final product. The board conveyance device conveys the board from a device on the upstream side of the production line to a device on the downstream side and includes a conveyor.

Management PC 50 is configured as a management device operated by a manager higher than operator M and is a computer configured to manage information related to the mounting process. Management PC 50 includes management control section 51, communication section 56, display section 57, and input section 58. Management control section 51 is configured as a microprocessor with CPU 52 at its center, and includes memory section 53 configured to store various data. Management control section 51 exchanges information with and controls communication section 56, display section 57, and input section 58. As shown in FIG. 3, memory section 53 stores production line information 54, operator correspondence information 55, mounting state information (not shown), and the like. Production line information 54 is a database in which the type and identifier of the device included in the production line, the production status, the information of the person in charge of the work, and the like are linked to each mounting line 11. operator correspondence information 55 is a database in which the operator ID, the operator name, the number of the portable terminal held, and information on the device of the operator being in charge of are linked with each work area. Management PC 50 can search portable terminal 18 of operator M in charge using production line information 54 and operator correspondence information 55 when an abnormality occurs in a device or the like. Mounting state information includes job information such as which component is disposed at which position of the mounting device of which mounting line 11. Communication section 56 outputs and acquires information to and from other devices via network 12. Display section 57 is a liquid crystal display for displaying a screen. Input section 58 is, for example, a device such as a mouse or a keyboard for inputting an instruction from an operator. Management PC 50 exchanges data with the devices of mounting lines 11 connected to network 12. For example, management PC 50 acquires the consumption state of solder from printing device 13, the consumption state of components accommodated in the feeders of mounting device 15, the inspection results from each inspection device, and the like via communication section 56. Management PC 50 also receives error information and the like from each devices.

Figure 4:
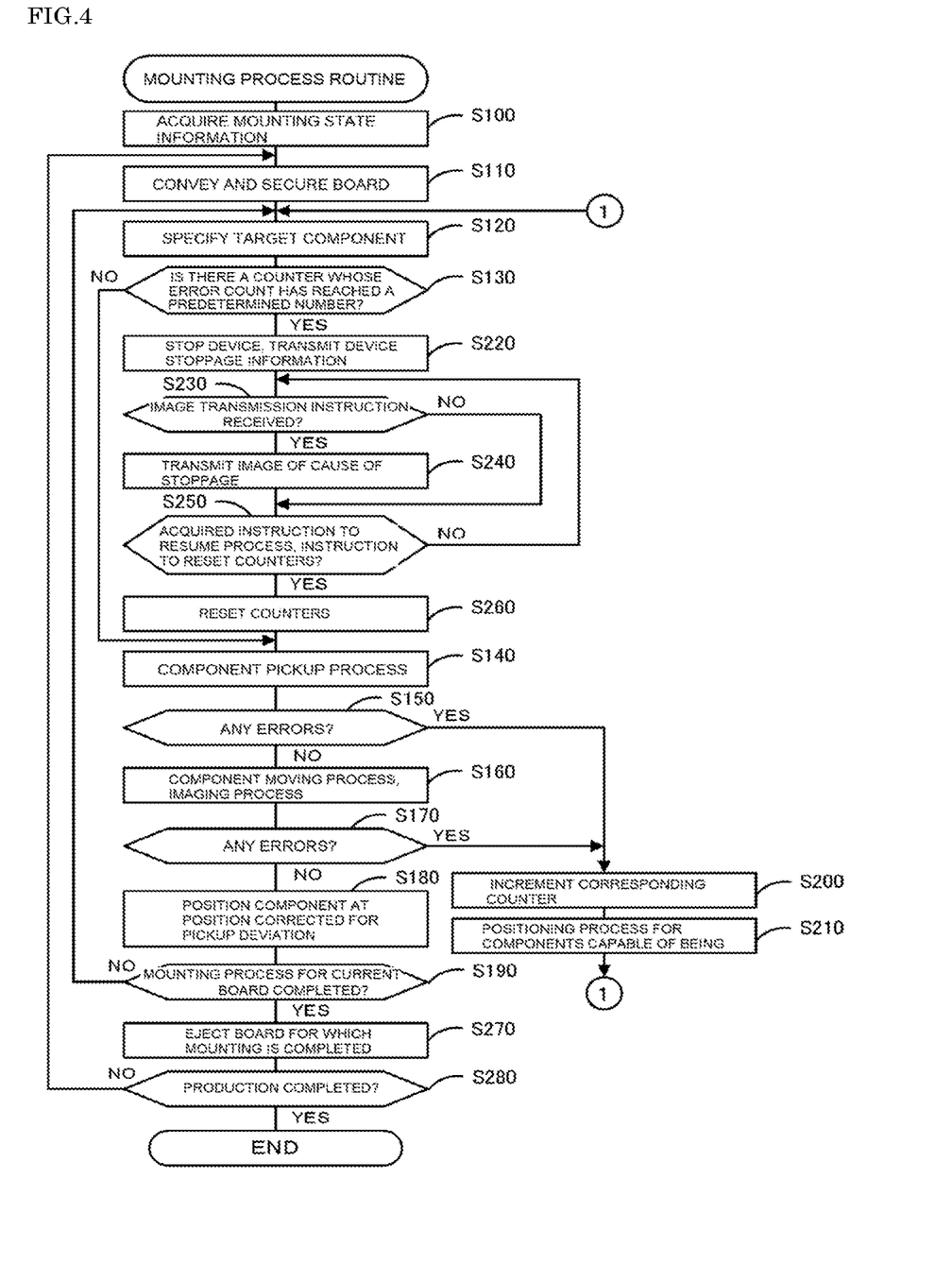
FIG. 4 A flow chart showing an example of a mounting process routine.

Next, as a specific example of the mounting-related process, the mounting process executed by mounting device 15 will be described. FIG. 4 is a flow chart showing an example of a mounting process routine executed by CPU 31 of mounting device 15. This routine is stored in memory section 32 and executed based on the mounting start input by operator M. Here, as a concrete example of a recovery-up error of mounting device 15, what will be mainly described are errors in picking up component P, and image processing errors of the captured image of component P in pickup position deviation and shape confirmation at the time of mounting. When this routine is started, CPU 31 first acquires the mounting state information from management PC 50 (S100) and then causes conveyance section 35 to convey and secure board S (S110). Next, CPU 31 sets target components P on board S based on an arrangement order in the mounting state data (S120). Next, CPU 31 determines whether there is counter 33 for the specified component P, for instance, to which the number of occurrences of recovery-up errors is equal to a predetermined number (S130). If the number of errors has not reached the predetermined count number, CPU 31 causes mounting section 38 to perform a process of picking up component P (S140). At this time, CPU 31 may perform a process of attaching suction nozzles 41 corresponding to component P to pickup section 40 prior to picking up component P.

Next, CPU 31 determines whether errors have occurred in the process of picking up component P (S150). Examples of errors in the process of picking up component P include suction errors and component P dropping. When errors have not occurred in picking up component P, the CPU 31 causes head moving section 39 to perform a moving process of component P and causes component imaging section 37 to perform imaging processing of component P (S160). At this time, after picking up component P, CPU 31 moves pickup section 40 so as to pass over component imaging section 37. Further, CPU 31 performs a matching processing using a predetermined reference image and the captured image, and determines whether component P being picked up is deformed beyond a permissible range, a pickup positional deviation, or the like. Next, CPU 31 determines S170 whether errors have occurred during this imaging process. Examples of image processing errors include identification errors in which component P cannot be identified due to the brightness or darkness of a captured image, a matching error in which the component shape of the reference image does not match the component shape of the captured image, and the like. When no errors have occurred in the image processing, CPU 31 obtains a pickup deviation amount based on the captured image, and provides the component P at a position where the deviation amount has been corrected (S180). At this time, CPU 31 may perform a discarding process on component P whose form is out of tolerance or component P whose sampling position deviates out of tolerance such that the positioning process cannot be accurately performed.

Subsequently, CPU 31 determines whether the mounting process of current board S has been completed (S190), and if not, executes S120 and subsequent processes. That is, CPU 31 sets component P to be picked up next, picks up component P, images component P, corrects the pickup deviation amount, and disposed component P on board S. During this process, when errors occur in S150 and S170, corresponding counter 33 is incremented by 1 (S200), components capable of being positioned are disposed on board S (S210), and S120 and subsequent processes are executed. CPU 31 may discard components P that cannot be positioned. In mounting system 10, even after the number of error occurrences reaches a predetermined number, processes other than the corresponding process are continued. When S120 and subsequent processes are repeatedly executed and there is counter 33 in which the number of instances of recovery-up errors have occurred in S130 reaches a predetermined number, CPU 31 stops the mounting process of the corresponding device and transmits device stoppage information to management PC 50 (S220).

Next, CPU 31 determines whether the image transmission command of the unit that caused the device stoppage has been received from management PC 50 (S230), and when the image transmission command has been received, transmits the image of the section that caused the device stoppage (S240). When the device is stopped due to a pickup error of the component P, CPU 31 moves pickup section 40 so that mark imaging section 42 is positioned above the pickup position where the error has occurred, causes mark imaging section 42 to image the pickup position of component P, and transmits the captured image to management PC 50. When the device is stopped due to an image processing error, the captured image in which the image processing error occurred is transmitted to management PC 50. After S240 or if the image transmission command has not been received in S230, CPU 31 determines whether the command to resume the mounting-related process and the command to reset counter 33 have been acquired (S250). The resume command and the resetting command may be acquired from management PC 50 via network 12, or may be acquired through the input by operator M from the operation panel of mounting device 15. The resume command from management PC 50, which will be described later in detail, is received by input section 58 after the manager remotely confirms the images of the causes of the device stoppage. The resume command from the operation panel is inputted from the operation panel after operator M has resolved the cause of the error in mounting device 15. If the resume command and the reset command have not been acquired, CPU 31 waits in the device stoppage state as is and when the resume command and the reset command are acquired, resets counters 33 (S260), cancels the device stoppage state, and executes S140 and subsequent processes. Resetting of counter 33 causes all counters 33 to be reset in accordance with the content of the reset command or causes the corresponding counters to be reset individually. Since mounting device 15 may cope with all errors, the method of resetting counter 33 can be selected at the time of resuming the process.

On the other hand, when the mounting process of the current board is completed in S190, CPU 31 causes conveyance section 35 to eject board S on which mounting has been completed (S270), and determines whether the production has been completed (S280). When production is not completed, CPU 31 executes S110 and subsequent processes, whereas when the production is completed, the routine is terminated as it is. In this manner, mounting device 15 performs the mounting process while stopping the process in response to the occurrence of the recovery-up error, and produces board S.

Figure 5:
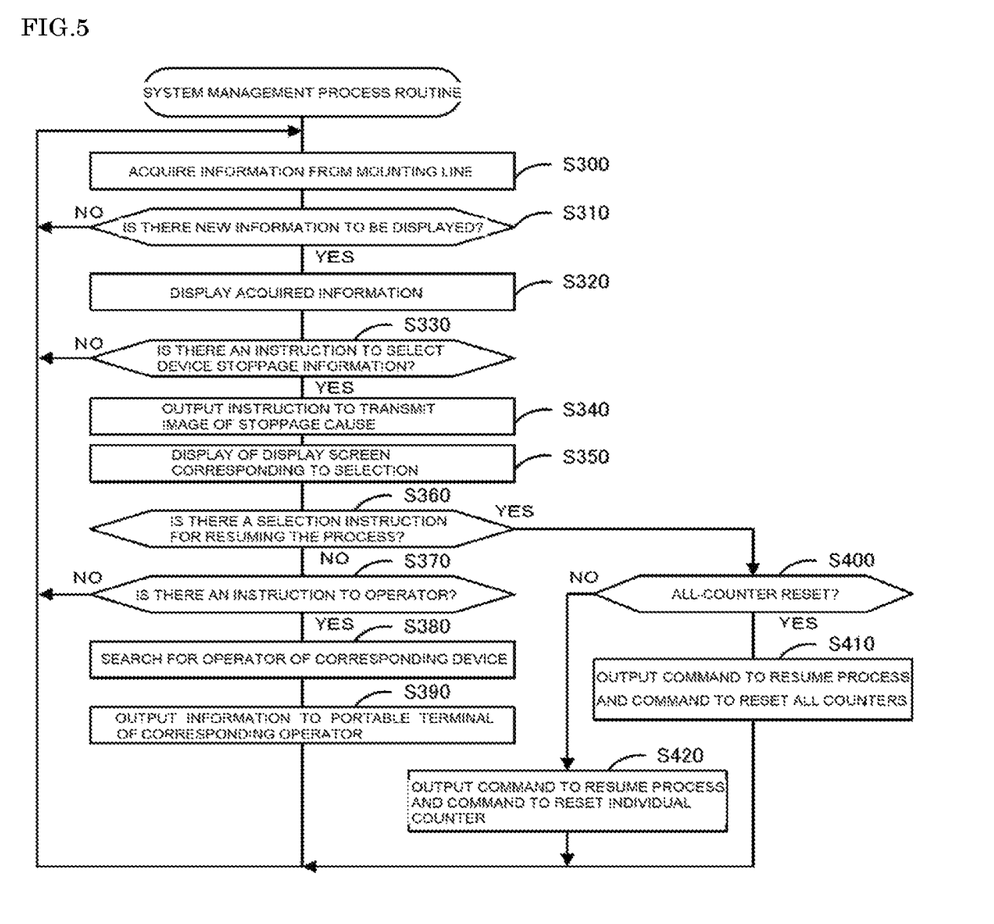
FIG. 5 A flow chart showing an example of a system management process routine.

Next, the operation of management PC 50 executed during the production process of mounting system 10, in particular, the process of informing the manager of information of mounting lines 11 will be described. FIG. 5 is a flow chart showing an example of a system management process routine executed by management control section 51 of management PC 50. These routines are stored in memory section 53 of management PC 50 and are executed during the production process of mounting system 10. When this routine is started, first, CPU 52 of management control section 51 acquires information from mounting lines 11 (S300). The information of mounting line 11 includes, for example, information on the completion of production, an instruction for a changeover for attaching the next feeder or the like, an instruction to start production by switching the mounting job, an instruction to replenish the viscous fluid or component P, an error such as a failure of the device, and device stoppage information due to a recovery-up error. Next, CPU 52 determines whether there is new information to be displayed from the acquired information (S310). When there is new information to be displayed, CPU 52 causes display section 57 to display the acquired information (S320).

Figure 6:
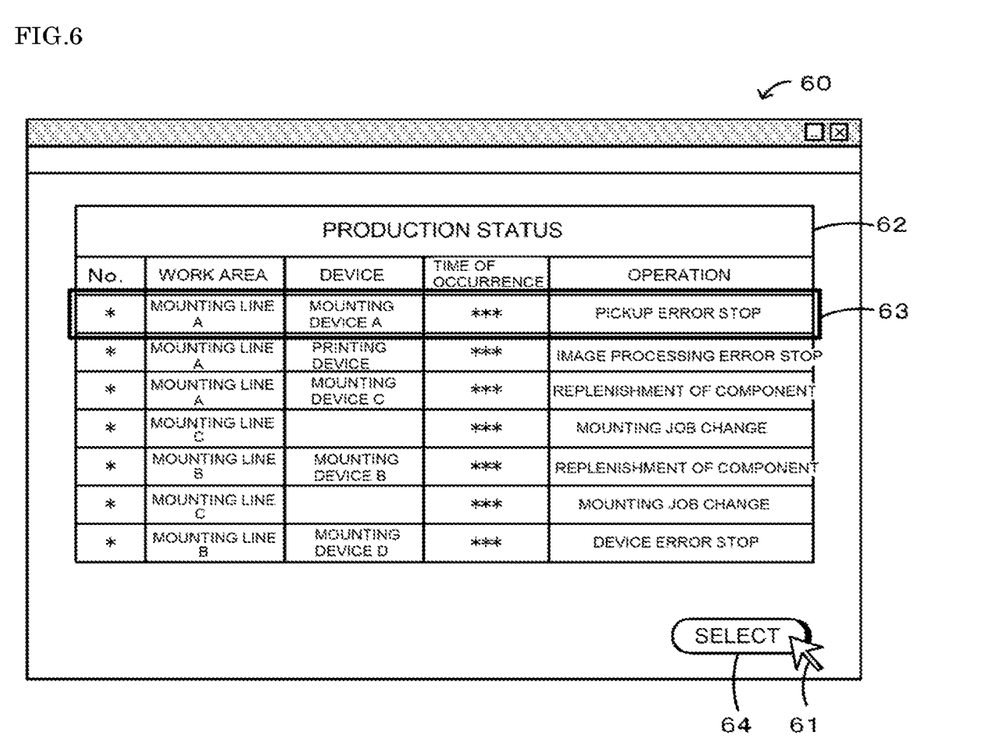
FIG. 6 A diagram illustrating an example of production status display screen 60.

FIG. 6 is a diagram illustrating an example of production status display screen 60 displayed on display section 57. Cursor 61, status display field 62, selection frame 63, selection key 64, and the like are disposed on production status display screen 60. Cursor 61 operates when information is selected. Status display field 62 is a field in which the name of the section, the time of occurrence of the work, the work content, and the like in each mounting line 11 are displayed. Selection frame 63 is a field for selecting a device or the like in which an operation is occurring and is moved by cursor 61. Selection key 64 is a key for confirming the content selected by selection frame 63. On production status display screen 60, new information updated at a predetermined timing is inserted and displayed in the uppermost row of status display field 62. The manager selects the content to be checked by operating selection frame 63 and selection key 64.

Next, CPU 52 determines whether there is an instruction to select the device stop information (S330). The device stoppage information is information in which the device stops due to a recovery-up error, and includes a device stoppage due to a pickup error of component P, a device stoppage due to an image processing error, and the like. When there is an instruction to select device stoppage information, CPU 52 transmits a command to transmit images related to the cause of stoppage to the corresponding device (S340), and displays a display screen corresponding to the selection (S350). For example, when stopping of mounting device 15 due to pickup errors is selected on production status display screen 60, CPU 52 displays pickup position display screen 70 on display section 57. Alternatively, when the stoppage of mounting device 15 due to an image processing error is selected, process image display screen 80 is displayed on display section 57.

Figure 7:
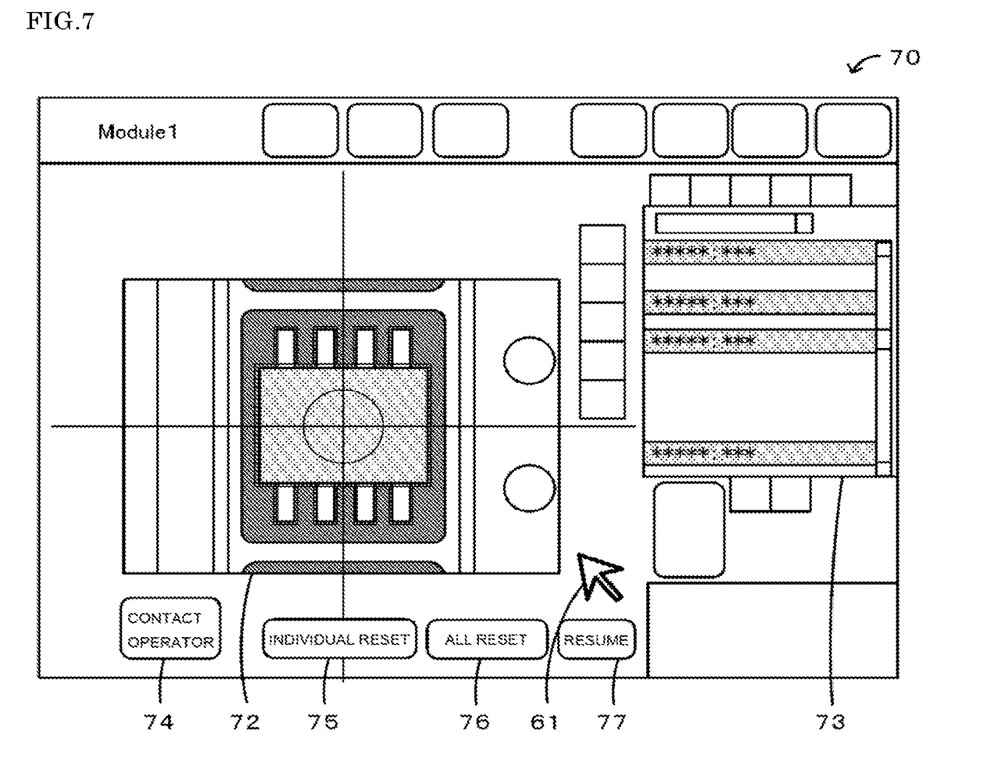
FIG. 7 A diagram illustrating an example of pickup position display screen 70.

FIG. 7 is a diagram illustrating an example of pickup position display screen 70 displayed on display section 57. Pickup position display screen 70 is a screen for confirming whether an operation by operator M is necessary for a pickup error of component P. Pickup position display screen 70 includes cursor 61, image display field 72, information display field 73, contact key 74, individual reset key 75, all reset key 76, and resume key 77. Image display field 72 is a field for displaying a captured image of the pickup position of component P in supply section 36. CPU 52 acquires the captured image of the pickup position of component P transmitted from mounting device 15 and displays the captured image in image display field 72. In image display field 72, an XY coordinate axis passing through the center of the planned pickup position, a circle of the suction nozzle at the planned pickup position, and a reference image are superimposed and displayed on the captured image. The manager can confirm these positional relationships in image display field 72. Information display field 73 is a field for displaying information relating to picking up components. In information display field 73, a correction value for correcting the pickup deviation of suction nozzle 41, a correction value for correcting the deviation of supply section 36, positional information of the height of component P and the pickup height, the nozzle moving speed at the time of picking up the component, and the like are displayed. In information display section 73, each numerical value can be changed based on input from input section 58. In information display field 73, when the numerical value is changed, the content of the change is reflected in the image displayed in image display field 72. When contact key 74 is pressed, the content of the error is outputted to portable terminal 18 of operator M who is in charge of the corresponding section. The manager confirms image display field 72, and presses contact key 74 when judging that the work of operator M is necessary. Individual reset key 75, when pressed, outputs a reset command which resets only counter 33 corresponding to supply section 36 currently being checked. All reset key 76 outputs a reset command which resets all counters 33 of mounting device 15 when it is depressed. When resume key 77 is pressed, a command to cancel the state in which the section is stopped due to a recovery-up error is outputted.

Figure 8:
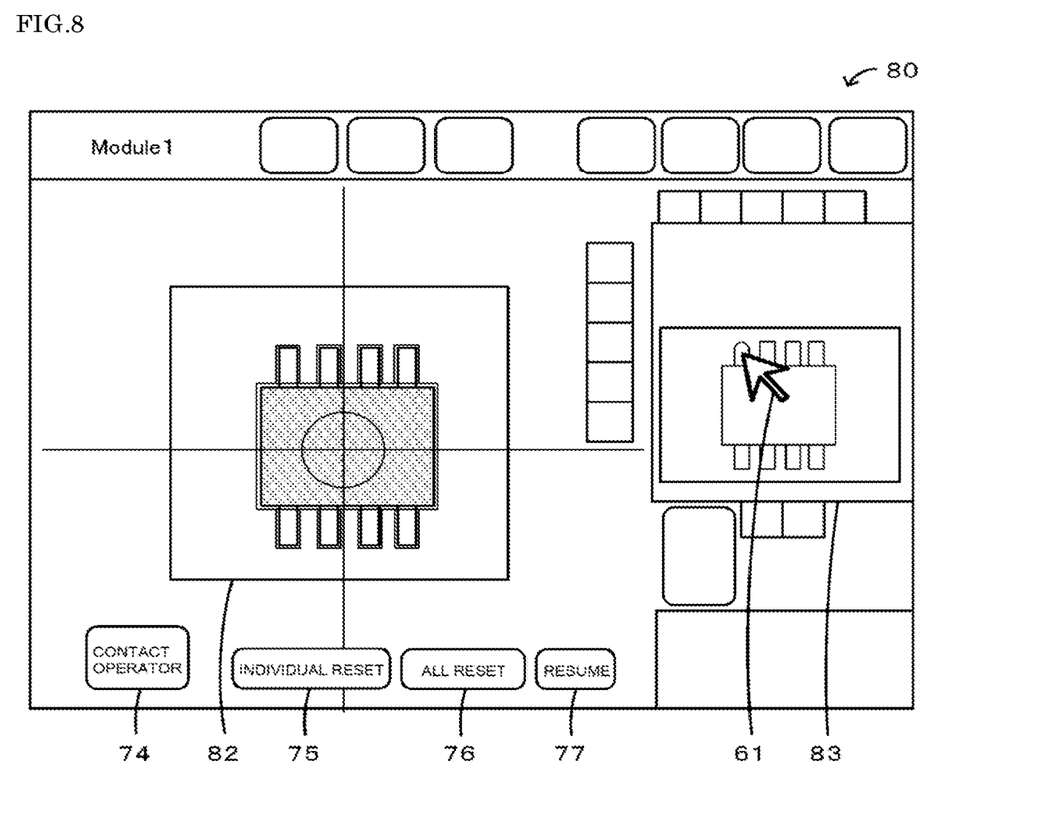
FIG. 8 A diagram illustrating an example of process image display screen 80.

FIG. 8 is a diagram illustrating an example of process image display screen 80 displayed on display section 57. Process image display screen 80 is a screen for confirming whether work by operator M is necessary for the image processing error of component P picked up by pickup section 40. Cursor 61, image display field 82, reference image editing field 83, contact key 74, individual reset key 75, all reset key 76, and resume key 77 are disposed in process image display screen 80. Image display field 82 is a field for displaying a captured image in which an image processing error has occurred. In image display field 82, a reference image of component P is superimposed on the captured image. The manager can confirm the relationship between the shape of captured component P and the shape of the reference image in image display field 72. Reference image editing field 83 is a field for editing a reference image. Depending on the supplier, components P may differ slightly in shape, such as being rounded or pointed. In reference image editing field 83, the administrator can edit and change such small differences in the reference image. The reference image edited in reference image editing field 83 is reflected in image display field 82. Contact key 74, individual reset key 75, all reset key 76, and resume key 77 of process image display screen 80 are the same as those of pickup position display screen 70, and a description thereof will be omitted. As described above, in management PC 50 for managing mounting lines 11, pickup position display screen 70 and process image display screen 80 are configured so that the content of the recovery-up error, the status of the device, and editing to change numerical values, shapes, and the like can be performed.

After the display screen is displayed in S350, CPU 52 determines whether a selection instruction for resuming the process is issued based on whether resume key 77 is pressed (S360). When there is no instruction to select resuming of the process, CPU 52 determines whether there is an instruction to contact operator M based on whether contact key 74 is pressed (S370). If there is an instruction to contact operator M, CPU 52 searches for operator M in charge of the corresponding device using operator correspondence information 55 (S380), and outputs the information to portable terminal 18 of corresponding operator M (S390). Operator M confirms the information received by portable terminal 18 and performs the work with the corresponding section. On the other hand, when there is a selection instruction to resume the process in S360, CPU 52 determines whether all-counter reset has been instructed based on whether all-reset key 76 or individual-reset key 75 has been pressed (S400). When the resetting of all the counters is instructed, CPU 52 causes the resume command of the process and the reset command of all counters 33 to the corresponding device (S410). On the other hand, if all-counter reset is not instructed, CPU 52 outputs a command to resume the process and a command to individually reset the counter 33 to the corresponding device (S420). Then, after S410 or S420, or when there is no information to be displayed in S310, when there is no instruction to select the device stoppage information in S330, or when there is no instruction to contact the operator in S370, CPU 52 repeatedly executes S300 and subsequent processes. In this management PC 50, since it is possible to confirm the content of the recovery-up error in each device of each mounting line 11, and the status of the device, and to edit to change numerical values, shapes, and the like, it is possible to instruct the resuming of the mounting-related process of the mounting-related device without confirming with operator M or the like.

Here, the correspondence relationship between the constituent elements of the present embodiment and the constituent elements of the present disclosure will be clarified. Conveyance section 22, printing section 23, conveyance section 26, inspection section 27, conveyance section 35, supply section 36, mounting section 38, and the like of the present embodiment correspond to a mounting-related processing section; communication section 43 corresponds to an acquisition section and an output section; communication section 24, communication section 28, communication section 43, and the like correspond to a reception section and a transmission section; and printing control section 21, inspection control section 25, mounting control section 30, and the like correspond to a process control section. Printing device 13, print inspection device 14, mounting device 15, mount inspection device 16, the reflow device, the reflow inspection device, and the board transfer device correspond to mounting-related devices, and management PC 50 corresponds to a managing device.

In maintenance PC 50 described above, when the device stoppage information indicating that the device has stopped is acquired from mounting device 15 (mounting-related device) based on the recovery-up error in which the device is stopped when the occurrence of an error is counted a predetermined count number, the information indicating that the device has stopped is displayed on display section 57. When the manager (user) confirms the contents displayed on displaying section 57 and then inputs an instruction to resume execution from input section 58, the management PC 50 outputs a resume command to resume the mounting-related process and a reset command to reset the counted number of errors to the stopped mounting-related device. In this manner, in this management PC 50, since the mounting-related process of the mounting-related device is resumed by the judgment of the manager, it is possible to further reduce the work that operator M must handle in the mounting-related device. After acquiring the device stoppage information from mounting device 15, management PC 50 outputs a command to transmit images that cause the device stoppage information to output to mounting device 15. When an image is acquired from mounting device 15, management control section 51 displays the image in display section 57. In this management PC 50, the manager can determine whether an operation by operator M in charge of mounting device 15 is required by checking the images that caused the device stoppage. Therefore, in this section, it is possible to more reliably reduce the work of operator M.

Mounting device 15 includes supply section 36 for supplying component P, pickup section 40 for collecting component P, component imaging section 37 for imaging component P, and conveyance section 35 configured to convey board S, and management control section 51 acquires a pickup error of pickup section 40, an image processing error of component imaging section 37, a conveyance error of conveyance section 35, and the like. In this management PC 50, it is possible to reduce the work of the operator for one or more of these errors. Further, management PC 50 also outputs information to portable terminal 18 of operator M working on mounting device 15, and management control section 51 outputs the work instruction to portable terminal 18 of operator M in charge of stopped mounting device 15 when the work instruction on stopped mounting device 15 is received from input section 58. In this management PC 50, it is possible to make operator M work more reliably with respect to the work that operator M must handle in mounting device 15.

When counting the predetermined count number, mounting device 15 stops the mounting process of mounting section 38 after the count of the number of errors of the section for stopping the device reaches the predetermined count number, and transmits the device stoppage information indicating that the device has stopped to management PC 50. Thereafter, when mounting device 15 receives a resume command for resuming the process and a reset command for the number of counts of errors from management PC 50, mounting device 15 resets the number of counts of errors of corresponding mounting device 15, and resumes the mounting process for stopped mounting section 38. In this manner, in mounting device 15, since the mounting-related process is resumed by the command from management PC 50, it is possible to further reduce the work that must be handled by operator M in mounting device 15.

Further, mounting device 15 includes mark imaging section 42 capable of capturing an image of supply section 36, and mounting control section 30 causes mark imaging section 42 to capture an image of the unit in question and transmit the captured image to management PC 50 when communication section 43 receives a command to transmit the image of the unit causing the device stoppage from management PC 50 after transmitting the device stoppage information from communication section 43. In this mounting device 15, since the manager of management PC 50 checks the images of the section causing the device stoppage, the manager can judge whether the work by operator M in charge of mounting device 15 is required so that the work of operator M can be reduced more reliably. Furthermore, mounting control section 30 of mounting device 15 stops the device based on one or more of the pickup error of pickup section 40, the image processing error of component imaging section 37, and the conveyance error of conveyance section 35, and transmits the device stoppage information to management PC 50. Mounting device 15 can reduce the work of operator M for one or more of these errors.

It is needless to say that the management device and the mounting-related device disclosed in this specification are not limited to the above-described embodiments and can be implemented in various forms as long as they belong to the technical scope of the present disclosure.

For example, in the embodiment described above, the CPU 52 transmits images of causes of device stoppage, but the present disclosure is not particularly limited thereto, and this process may be omitted. For example, in pickup position display screen 70, image display field 72 may be omitted, and in process image display screen 80, image display field 82 may be omitted. In this case, an error code or the like may be displayed instead of the captured image. Even in this manner, in the mounting-related device, since the mounting-related process is resumed by the command from maintenance PC 50, it is possible to further reduce the work that operator M must handle in mounting device 15.

In the embodiment described above, information display field 73 is provided on pickup position display screen 70, but this may be omitted. In information display field 73, each numerical value can be changed, but this may be omitted. Further, although the change content of information display field 73 is reflected in image display field 72, this may be omitted. In addition, although process image display screen 80 includes reference image editing field 83, this may be omitted. In reference image editing field 83, the reference image can be edited, but this may be omitted. Further, image display field 82 reflects the changed content of reference image editing field 83, but this may be omitted.

In the embodiment described above, the device stoppage due to the error of mounting device 15 has been described, but the same applies to printing device 13, print inspection device 14, mount inspection device 16, the reflow device, the reflow inspection device, and the like. Mounting line 11 need not include one or more of the above devices.

In the above-described embodiment, although mounting system 10 is described as being provided with mounting device 15 and management PC 50, mounting system 10 may be provided with only mounting device 15 or only management PC 50.

Here, in the management device of the present disclosure, the output section may output a transmission command of an image of a cause of the device stoppage to the mounting-related device after the device stoppage information is acquired from the acquisition section, and the management control section may display the image on the display section when the acquisition section acquires the image. In this management device, since the user can judge whether the work by the operator in charge of the mounting-related device is necessary by checking the image of the mounting-related processing section or the like that caused the device stoppage, the work of the operator can be reduced more reliably.

In the management device, the mounting-related device comprises the mounting-related processing section having at least one of a supply section configured to supply a component; a collection section configured to collect the component; an imaging section for imaging the component; a conveyance section configured to convey a board, and a printing section configured to print a viscous fluid onto the substrate, and an inspection section for inspecting a state of the component and/or the substrate; and the acquisition section acquires the device stoppage information based on one or more of a pickup error of the pickup section; an image processing error of the imaging section; a conveyance error of conveyance section; a print processing error of the printing section, and an inspection error of the inspection section. The management device reduces the work of the operator for one or more of these errors. The error that causes the device to stop upon counting a predetermined count number may include a pickup error of the pickup section or an image processing error of the imaging section.

In the management device, the output section may also output information to a terminal of the operator working in the mounting-related device, and the management control section may input a work instruction from the input section to the stopped mounting-related device, and may output, upon a work instruction from the input section being inputted to the mounting-related device in suspension, the work instruction to the terminal of the operator in charge of the stopped mounting-related device. In this management device, it is possible to make the operator work more reliably with respect to the work that the operator must handle in the mounting-related device.

The mounting-related device disclosed in this specification is a mounting-related device, used in a mounting system including a management device configured to manage information, wherein the mounting-related device exchanges information with the management device via a network and comprises: a reception section configured to receive information from the management device via the network; a transmission section configured to transmit information to the management device via the network; a mounting-related processing section configured to perform a mounting-related process related to a mounting process for mounting a component on a board, and a process control section configured to stop the mounting-related process of the mounting-related processing section, after the number of counted errors of the mounting-related processing section configured to stop the device reaches a predetermined number; transmits device stoppage information, indicating that the device has stopped, from the transmitting section to the management device, and thereafter, when the reception section receives a command to resume the mounting-related process and a command to reset the count number of errors from the management device, resets the counted number of errors and causes the mounting-related processing section to resume the stopped mounting-related process.

The mounting-related device stops the mounting-related process of the mounting-related processing section after the number of counted errors of the mounting-related processing section configured to stop the device reaches a predetermined number and transmits the device stoppage information indicating that the device has stopped to the management device. Thereafter, when the mounting-related device receives a command to resume the mounting-related process and a command to reset the counting of errors from the management device, the mounting-related device resets the counted number of errors and causes the mounting-related processing section to resume the stopped mounting-related process. As described above, in this mounting-related device, since the mounting-related processing is resumed by the command from the management device, it is possible to further reduce the work that the operator must handle in the mounting-related device.

The mounting-related device may include an imaging section configured to capture an image of the mounting-related processing section; and the process control section, after transmitting the device stoppage information from the transmitting section, causes the imaging section to capture an image of the mounting-related processing section and causes the management device to transmit the captured image to the transmitting section when the receiving section receives a command to transmit an image of the cause of the device stoppage from the management device. In this mounting-related device, since the user of the management device confirms the image of the mounting-related processing section or the like that caused the device stoppage, the user can judge whether the work by the operator in charge of the mounting-related device is necessary, and therefore the work of the operator can be reduced more reliably.

In the mounting-related device, the mounting-related processing section may include at least one of a supply section for supplying a component, a pickup section for picking up the component, an imaging section for capturing the component, a conveyance section configured to convey a board, a printing section for printing a viscous fluid on the substrate, and an inspection section for inspecting a state of the component and/or the substrate; and the process control section may stop the device based on one or more information of a pickup error of the pickup section, an image processing error of the imaging section, a conveyance error of the conveyance section, a print processing error of the printing section, and an inspection error of the inspection section, and the process control section may cause the transmission section to transmit the device stoppage information. This mounting-related device can reduce the work of the operator for one or more of these errors.

The mounting system disclosed in this specification is provided with any of the above-described management devices and any of the above-described mounting-related devices. Since the mounting system includes the management device and the mounting-related device described above, the mounting-related process of the mounting-related device is resumed based on the judgment of the management device, thereby making it possible to further reduce the work that must be handled by the operator in the mounting-related device.

INDUSTRIAL APPLICABILITY

The management device and the mounting-related device of the present disclosure can be used in the technical field of a device for performing processes such as picking up and arranging components.

REFERENCE SIGNS LIST

10 Mounting system, 11 Mounting line, 12 Network, 13 Printing device, 14 Print inspection device, 15 Mounting device, 16 Mount inspection device, 17 ID card, 18 Portable terminal, 21 Printing control section, 22 Conveyance section, 23 Printing section, 24 Communication section, 25 Inspection control section, 26 Conveyance section, 27 Inspection section, 28 Communication section, 30 Mounting control section, 31 CPU, 32 Memory section, 33 Counter, 35 Conveyance section, 36 Supply section, 37 Component imaging section, 38 Mounting section, 39 Head moving section, 40 Pickup section, 41 Suction nozzle, 42 Mark imaging section, 43 Communication section, 50 Management PC, 51 Management control section, 52 CPU, 53 Memory section, 54 Production line information, 55 operator correspondence information, 56 Communication section, 57 Display section, 58 Input section, 60 Production status display screen, 61 Cursor, 62 Status display field, 63 Selection frame, 64 Selection key, 70 Pickup position display screen, 72 Image display field, 73 Information display field, 74 Contact key, 75 Individual reset key, 76 All reset key, 77 Resume key, 80 Process Image display screen, 82 Image display field, 83 Reference image editing field, M Operator, P Component, S Board.

The invention claimed is:

1. A management device, used in a mounting system including one or more mounting-related devices and exchanging information with the one or more mounting-related devices via a network, each of the one or more mounting-related devices being provided with a mounting-related processing section configured to perform a mounting-related process for mounting a component on a board, the management device comprising:
- a display configured to display information to a user;
- an input interface configured to receive an instruction from the user;
- a communication interface configured to acquire information from the one or more mounting-related devices via the network, and to output information to the one or more mounting-related devices via the network; and
- a management computer configured to
  - increment an error count each time an error occurs in one of the mounting-related devices,
  - stop the one of the mounting-related devices when the error count exceeds a predetermined count number,
  - instruct a camera of the one of the mounting-related devices to move to a location of the mounting-related processing section where the error occurred,
  - instruct the camera to image the location of the mounting-related processing section where the error occurred,
  - cause stoppage information to display on the display when the communication interface acquires device stoppage information from the one of the mounting-related devices based on the error,
  - cause the display to display the image of the location of the mounting-related processing section where the error occurred, and
  - cause the communication interface to output a resume command to resume the mounting-related process and a reset command to reset the error count to the one of the mounting-related devices that is stopped without providing information of the error to an operator assigned to the one of the mounting-related devices.

2. The management device of claim 1,
wherein the communication interface is configured to output, after acquiring the device stoppage information, a command to transmit the image of the location of the mounting-related processing section where the error occurred.

3. The management device of claim 1,
wherein the mounting-related processing section includes at least one of: a supply configured to supply the component, a mounting head configured to pick up the component, a conveyor configured to convey the board, a printer configured to print a viscous fluid onto the board, and an inspection device configured to inspect a state of the component and/or the board; and
wherein the communication interface is configured to acquire the device stoppage information based on information of one or more of: a pickup error of the mounting head, a conveyance error of conveyor, a print processing error of the printer, and an inspection error of the inspection device.

4. The management device according to claim 1,
wherein the communication interface is configured to output information of the error to a terminal of the operator assigned to the one of the mounting-related devices, and
wherein the management computer is configured to, upon a work instruction being inputted to the input interface, cause the communication interface to output the work instruction to the terminal of the operator assigned to the one of the mounting-related devices.

5. The mounting system comprising the management device of claim 1.

6. The management device of claim 1,
wherein the location of the mounting-related processing section where the error occurred is a component pickup position of a component feeder and the camera is attached to a mounting head of the one of the mounting-related devices.

7. A mounting-related device, used in a mounting system including a management device configured to manage information, wherein the mounting-related device exchanges information with the management device via a network and comprises:
- a communication interface configured to receive information from the management device via the network, and to transmit information to the management device via the network,
- a mounting-related processing section configured to perform a mounting-related process related to a mounting process for mounting a component on a board, and
- a process computer configured to
  - increment an error count each time an error occurs in the mounting-related processing section,
  - stop the mounting-related process of the mounting-related processing section, when the error count of the mounting-related processing section reaches a predetermined number;
  - instruct a camera of the mounting-related device to move to a location of the mounting-related processing section where the error occurred,
  - instruct the camera to image the location of the mounting-related processing section where the error occurred,
  - transmit, with the communication interface, device stoppage information, indicating that the device has stopped, to the management device,
  - transmit, with the communication interface, the image of the location of the mounting-related processing section where the error occurred, and
  - when the communication interface receives a command to resume the mounting-related process and a command to reset the error count from the management device;
  - reset the error count for each of a plurality of errors based upon a content of the command to reset the error count,
  - reset corresponding error counts individually based upon the content of the command to reset the error count, and
  - cause the mounting-related processing section to resume the stopped mounting-related process.

8. The mounting-related device of claim 7,
wherein the process computer, after transmitting the device stoppage information, causes the camera to capture the image of the location of the mounting-related processing section where the error occurred when the communication interface receives a command to transmit the image of the location of the mounting-related processing section where the error occurred.

9. The mounting-related device of claim 7,
wherein the mounting-related processing section includes at least one of: a supply configured to supply the component; a mounting head configured to pick up the component; a conveyor configured to convey the board; a printer configured to print a viscous fluid on the board; and an inspection device configured to inspect a state of the component and/or the board, and wherein the process computer is configured to stop the mounting-related process based information of one or more of: a pickup error of the mounting head; a conveyance error of the conveyor; a print processing error of the printer, and an inspection error of the inspection device.

10. The mounting system comprising the management device of claim 7.

11. A management device, used in a mounting system including one or more mounting-related devices and exchanging information with the one or more mounting-related devices via a network, each of the one or more mounting-related devices being provided with a mounting-related processing section configured to perform a mounting-related process for mounting a component on a board, the management device comprising:

a display configured to display information to a user;

an input interface configured to receive an instruction from the user;

a communication interface configured to acquire information from the one or more mounting-related devices via the network, and to output information to the one or more mounting-related devices via the network; and a management computer configured to cause stoppage information to display on the display when the communication interface acquires device stoppage information from one of the mounting-related devices based on an error, instruct a camera of the one of the mounting-related devices to image a location of the mounting-related processing section where the error occurred, cause the display to display the image of the location of the mounting-related processing section where the error occurred, and cause the communication interface to output a resume command to resume the mounting-related process and a reset command to reset an error count of the one of the mounting-related devices that is incremented each time the error occurs in the one of the mounting-related devices to the one of the mounting-related devices that is stopped without providing information of the error to an operator assigned to the one of the mounting-related devices.

12. The management device of claim 11, wherein the communication interface is configured to output, after acquiring the device stoppage information, a command to transmit the image of the location of the mounting-related processing section where the error occurred.

13. The management device of claim 11, wherein the mounting-related processing section includes at least one of a supply configured to supply the component, a mounting head configured to pick up the component, a conveyor configured to convey the board, a printer configured to print a viscous fluid onto the board, and an inspection device configured to inspect a state of the component and/or the board; and wherein the communication interface is configured to acquire the device stoppage information based on information of one or more of: a pickup error of the mounting head, a conveyance error of conveyor, a print processing error of the printer, and an inspection error of the inspection device.

14. The management device according to claim 11, wherein the communication interface is configured to output information of the error to a terminal of the operator assigned to the one of the mounting-related devices, and wherein the management computer is configured to, upon a work instruction being inputted to the input interface, cause the communication interface to output the work instruction to the terminal of the operator assigned to the one of the mounting-related devices.

15. The mounting system comprising the management device of claim 11.

16. The management device of claim 11, wherein the location of the mounting-related processing section where the error occurred is a component pickup position of a component feeder and the camera is attached to a mounting head of the one of the mounting-related devices.

* * * * *